(12) United States Patent
Shi et al.

(10) Patent No.: US 9,419,826 B2
(45) Date of Patent: Aug. 16, 2016

(54) ADAPTIVE FILTERING METHOD AND SYSTEM BASED ON ERROR SUB-BAND

(71) Applicant: Huawei Technologies Co., Ltd., Shenzhen (CN)

(72) Inventors: Dongyuan Shi, Chengdu (CN); Dongmei He, Chengdu (CN); Meng Cai, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/671,810

(22) Filed: Mar. 27, 2015

(65) Prior Publication Data
US 2015/0207649 A1    Jul. 23, 2015

Related U.S. Application Data

(63) Continuation of application No. PCT/CN2012/082224, filed on Sep. 27, 2012.

(51) Int. Cl.
*H04L 25/03* (2006.01)
*H03H 21/00* (2006.01)

(52) U.S. Cl.
CPC .......... *H04L 25/03057* (2013.01); *H04L 25/03* (2013.01); *H04L 25/03019* (2013.01); *H03H 21/0012* (2013.01); *H03H 2021/007* (2013.01); *H03H 2021/0041* (2013.01); *H04L 2025/03617* (2013.01); *H04L 2025/03636* (2013.01)

(58) Field of Classification Search
None
See application file for complete search history.

(56) References Cited

U.S. PATENT DOCUMENTS

| | | | |
|---|---|---|---|
| 6,144,711 A * | 11/2000 | Raleigh | H04B 7/0615 375/346 |
| 6,600,495 B1 | 7/2003 | Boland et al. | |
| 2004/0071284 A1 | 4/2004 | Abutalebi et al. | |
| 2006/0153321 A1* | 7/2006 | Bhuvanagiri | H03H 17/0225 375/350 |
| 2010/0017195 A1 | 1/2010 | Villemoes | |
| 2011/0106541 A1 | 5/2011 | Ekstrand et al. | |
| 2011/0158363 A1* | 6/2011 | Andersen | H03H 21/0012 375/350 |
| 2011/0302230 A1 | 12/2011 | Ekstrand | |
| 2014/0304315 A1 | 10/2014 | Ekstrand | |

FOREIGN PATENT DOCUMENTS

| | | |
|---|---|---|
| CN | 1354906 A | 6/2002 |
| CN | 101923862 A | 12/2010 |
| CN | 102098258 A | 6/2011 |
| CN | 102629105 A | 8/2012 |

(Continued)

OTHER PUBLICATIONS

Merched, R., "A New Delayless Subband Adaptive Filter Structure," IEEE Transactions on Signal Processing, vol. 47, No. 6, Jun. 1999, pp. 1580-1591.
Morgan, D.R., "A Delayless Subband Adaptive Filter Architecture," IEEE Transactions on Signal Processing, vol. 43, No. 8, Aug. 1995, pp. 1819-1830.

(Continued)

*Primary Examiner* — Leon-Viet Nguyen
(74) *Attorney, Agent, or Firm* — Slater Matsil, LLP

(57) ABSTRACT

The present invention discloses an adaptive filtering method and system based on an error sub-band. The present invention includes performing analysis filtering processing on an error signal and an input signal to obtain an error sub-band signal and an input sub-band signal respectively; and performing calculation according to the input sub-band signal and the error sub-band signal to obtain a new adaptive filtering weight, and updating a weight in an adaptive filter.

17 Claims, 7 Drawing Sheets

(56) References Cited

FOREIGN PATENT DOCUMENTS

| GB | 2439988 A | 1/2008 |
|---|---|---|
| JP | 2006222884 A | 8/2006 |

OTHER PUBLICATIONS

Pradhan, S.S., "A New Approach to Subband Adaptive Filtering," IEEE Transactions on Signal Processing, vol. 47, No. 3, Mar. 1999, pp. 655-664.

* cited by examiner

ADAPTIVE FILTERING METHOD AND SYSTEM BASED ON ERROR SUB-BAND

This application is a continuation of International Application No. PCT/CN2012/082224, filed on Sep. 27, 2012, which is hereby incorporated by reference in its entirety.

TECHNICAL FIELD

The present invention relates to the field of signal processing technologies, and in particular, to an adaptive filtering method and system based on an error sub-band.

BACKGROUND

Adaptive filtering is widely applied in fields such as system identification, echo interference cancellation, and channel equalization, and a most commonly used method is a transversal filtering method adjusted by LMS (least mean square algorithm). Specifically, an adaptive algorithm is used to automatically correct a weight vector according to an estimation error signal, so that the error signal achieves a least mean square; however, convergence of the method decreases as a weight value of a filter increases.

In order to improve convergence of a transversal filtering method algorithm adjusted by LMS, an analysis filter bank is added in a path of an input signal, so that autocorrelation of the input signal is reduced, thereby improving the convergence of the algorithm. However, because the input signal passes through a group of analysis filters, a group of integrated filters are further needed to restore the signal when the group of filters operate; in this way, complexity of an adaptive filtering device structure is greatly increased, thereby increasing the amount of calculation of a whole adaptive filtering algorithm, so that it is difficult to apply the adaptive filtering algorithm to a digital system of high-speed processing.

SUMMARY

Embodiments of the present invention provide an adaptive filtering method and system based on an error sub-band, so as to reduce the amount of calculation of an adaptive filtering algorithm.

To achieve the foregoing objective, the following technical solutions are used in the embodiments of the present invention:

An adaptive filtering method based on an error sub-band includes: receiving, by an adaptive filter, an input signal, performing adaptive filtering processing on the input signal according to an adaptive filtering weight currently stored in the adaptive filter, so as to obtain an adaptive filtering signal, and transmitting the adaptive filtering signal to a subtractor; receiving, by the subtractor, a reference signal and the adaptive filtering signal, performing calculation according to the reference signal and the adaptive filtering signal to obtain an error signal, and transmitting the error signal to an error sub-band filter, where the reference signal is a signal generated after the input signal passes through a real channel; receiving, by the error sub-band filter, the error signal, performing sub-band analysis filtering processing on the error signal to obtain an error sub-band signal, and transmitting the error sub-band signal to an adaptive weight updater; receiving, by an input signal analysis filter, the input signal, performing sub-band analysis filtering processing on the input signal to obtain an input sub-band signal, and transmitting the input sub-band signal to the adaptive weight updater; and receiving, by the adaptive weight updater, the error sub-band signal and the input sub-band signal, performing calculation according to the error sub-band signal and the input sub-band signal to obtain a new adaptive filtering weight, and replacing the adaptive filtering weight currently stored in the adaptive filter with the new adaptive filtering weight.

An adaptive filtering system based on an error sub-band, including: an adaptive filter, configured to receive an input signal, perform adaptive filtering processing on the input signal according to an adaptive filtering weight currently stored in the adaptive filter, so as to obtain an adaptive filtering signal, and transmit the adaptive filtering signal to a subtractor; the subtractor, configured to receive a reference signal and the adaptive filtering signal, perform calculation according to the reference signal and the adaptive filtering signal to obtain an error signal, and transmit the error signal to an error sub-band filter, where the reference signal is a signal generated after the input signal passes through a real channel; the error sub-band filter, configured to receive the error signal, perform sub-band analysis filtering processing on the error signal to obtain an error sub-band signal, and transmit the error sub-band signal to an adaptive weight updater; an input signal analysis filter, configured to receive the input signal, perform sub-band analysis filtering processing on the input signal to obtain an input sub-band signal, and transmit the input sub-band signal to the adaptive weight updater; and the adaptive weight updater, configured to receive the error sub-band signal and the input sub-band signal, perform calculation according to the error sub-band signal and the input sub-band signal to obtain a new adaptive filtering weight, and replace the adaptive filtering weight currently stored in the adaptive filter with the new adaptive filtering weight.

According to the adaptive filtering method and system based on an error sub-band that are provided in the embodiments of the present invention, analysis filtering processing is performed on an error signal and an input signal to obtain an error sub-band signal and an input sub-band signal respectively; calculation is performed according to the input sub-band signal and the error sub-band signal to obtain a new adaptive filtering weight, and a weight in an adaptive filter is updated, so that when the adaptive filter works, the adaptive filter may directly use an updated weight to perform adaptive filter processing on the input signal, so as to obtain an adaptive filtering signal. Compared with a technical solution in the prior art, in which analysis filtering processing needs to be first performed on an input signal, and a processing result is input to an adaptive filter to perform adaptive processing to obtain an adaptive filtering sub-band signal, and then an adaptive filtering signal can be obtained by performing integrated filtering processing on the adaptive filtering sub-band signal, in the present invention, a processing result of an adaptive filter does not need to be restored; compared with the technical solution provided in the prior art, an integrated filter for signal reconstruction is omitted, thereby reducing the amount of calculation of an adaptive filtering algorithm.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Embodiment 1

Figure 1:
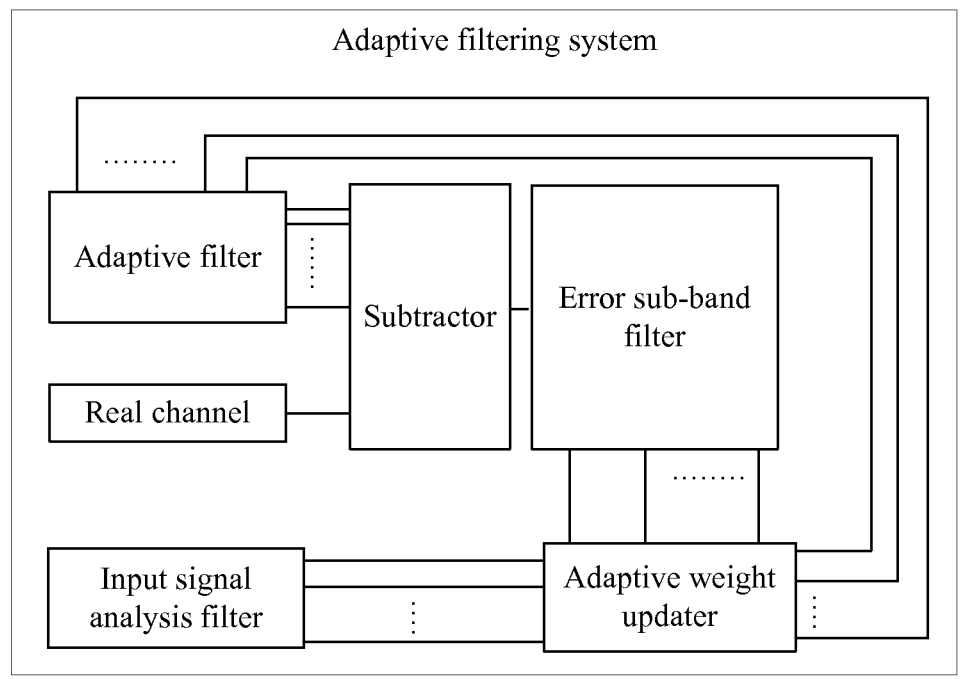
FIG. 1 is a composition block diagram of an adaptive filtering system based on an error sub-band according to the present invention.

This embodiment of the present invention provides an adaptive filtering method based on an error sub-band, where the method may be applied to an adaptive filtering system shown in FIG. 1, and the system includes: an adaptive filter, a subtractor, an error sub-band filter, an input signal analysis filter, and an adaptive weight updater.

An ingress port of the adaptive filter is configured to receive an input signal, and an egress port of the adaptive filter is connected to one ingress port of the subtractor; the other ingress port of the subtractor is configured to receive a reference signal, and an egress port of the subtractor is connected to the error sub-band filter; an ingress port of the input signal analysis filter is configured to receive the input signal, and an egress port of the input signal analysis filter is connected to one ingress port of the adaptive weight updater; and an egress port of the error sub-band filter is connected to the other ingress port of the adaptive weight updater.

The input signal is a digital signal, which is a signal to be processed by the adaptive filter; and the reference signal is a signal generated after the input signal passes through a real channel, where the real channel may be a physical signal processing device, or may be a signal propagation path in free space, which is not limited in this embodiment of the present invention.

Figure 2:
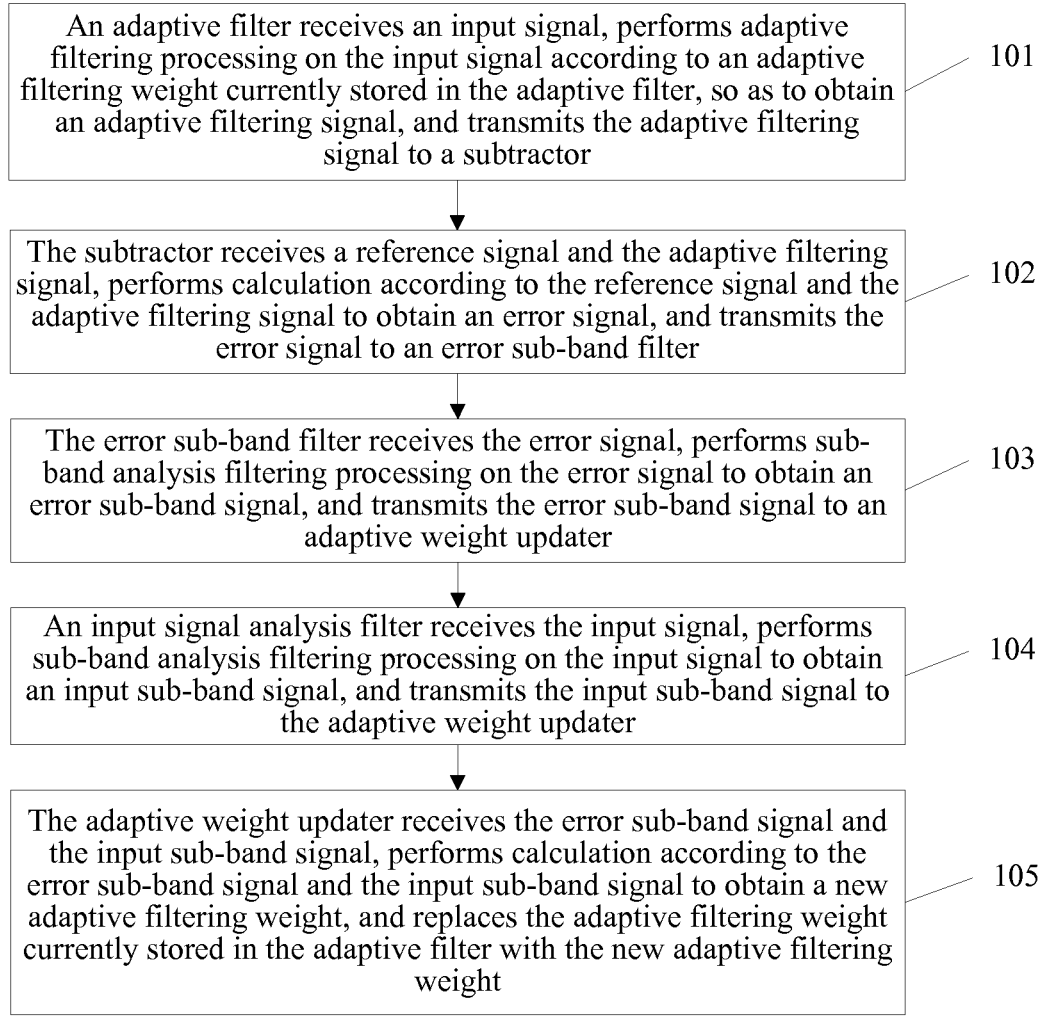
FIG. 2 is a flowchart of an adaptive filtering method based on an error sub-band according to Embodiment 1 of the present invention.

As shown in FIG. 2, based on the foregoing adaptive filtering system, the method includes:

101. An adaptive filter receives an input signal, performs adaptive filtering processing on the input signal according to an adaptive filtering weight currently stored in the adaptive filter, so as to obtain an adaptive filtering signal, and transmits the adaptive filtering signal to a subtractor.

When the adaptive filtering weight currently stored in the adaptive filter is not updated by an adaptive weight updater, the adaptive filtering weight is a pre-stored default value, and a value of the default value may be an empirical value in the technical field; after the adaptive weight updater updates the adaptive filtering weight currently stored in the adaptive filter, the adaptive filtering weight currently stored in the adaptive filter is an updated adaptive filtering weight.

It should be noted that the adaptive filter signal is not merely one signal, and the number of adaptive filtering signals depends on the number of taps of the adaptive filter. In the adaptive filter, one branch of the adaptive filter generates one adaptive filter signal.

102. The subtractor receives a reference signal and the adaptive filtering signal, performs calculation according to the reference signal and the adaptive filtering signal to obtain an error signal, and transmits the error signal to an error sub-band filter.

103. The error sub-band filter receives the error signal, performs sub-band analysis filtering processing on the error signal to obtain an error sub-band signal, and transmits the error sub-band signal to an adaptive weight updater.

It should be noted that the error sub-band signal is not merely one signal, and the number of error sub-band signals depends on the number of frequency band divisions of the error sub-band filter. In the error sub-band filter, one branch of the error sub-band filter generates one error sub-band signal.

104. An input signal analysis filter receives the input signal, performs sub-band analysis filtering processing on the input signal to obtain an input sub-band signal, and transmits the input sub-band signal to the adaptive weight updater.

It should be noted that the input sub-band signal is not merely one signal, and the number of input sub-band signals depends on the number of frequency band divisions of the input signal analysis filter. In the input signal analysis filter, one branch of the input signal analysis filter generates M input sub-band signals, where M is the number of frequency band divisions of the input signal analysis filter.

105. The adaptive weight updater receives the error sub-band signal and the input sub-band signal, performs calculation according to the error sub-band signal and the input sub-band signal to obtain a new adaptive filtering weight, and replaces the adaptive filtering weight currently stored in the adaptive filter with the new adaptive filtering weight.

For a calculation method of the new adaptive filtering weight, reference may be made to the following formula a, and the formula is specifically:

$$\hat{s}_{ik}(n+1) = \hat{s}_{ik}(n) + 2\mu \sum_{l=0}^{M-1} \alpha_l e_l(n) x_{li}(n-k) \quad \text{(Formula a)}$$

$$i = 0, 1, \ldots, (M-1)$$

$$k = 0, 1, \ldots, \left(\frac{L}{M} - 1\right)$$

where $\hat{s}_{ik}(n+1)$ is an updated adaptive filtering weight, $\hat{s}_{ik}(n)$ is a current adaptive filtering weight, $\mu$ and $\alpha_l$ are both preset constants, L is the number of taps of an adaptive filter, M is the number of sub-bands obtained by means of analysis filtering processing, $e_l(n)$ is an error signal value of a first branch, and $x_{li}(n-k)$ is an input signal value of an $i^{th}$ component of the first branch.

Figure 3:
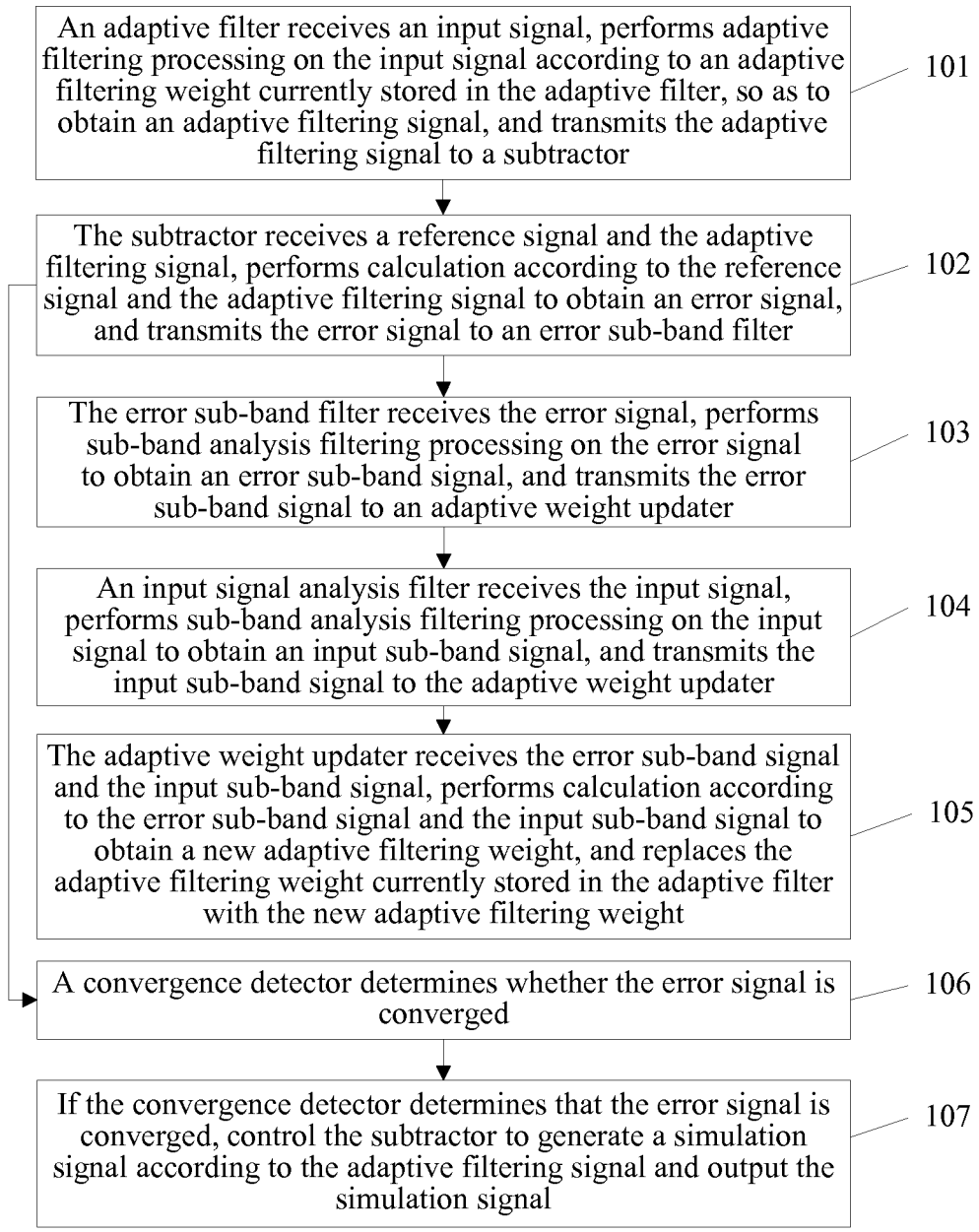
FIG. 3 is a flowchart of another adaptive filtering method based on an error sub-band according to Embodiment 1 of the present invention.

It should be noted that when a difference between a real output signal and an adaptive filtering output signal that is obtained by performing adaptive filtering on the input signal by using the current adaptive filtering weight steadily fluctuates in a relatively small range, that is, when the error signal is converged, it may be considered that the adaptive filter can simulate a real channel. In this case, a signal of the adaptive filter needs to be output. Therefore, the following steps are further arranged after step 102, and as shown in FIG. 3, the method further includes:

106. A convergence detector determines whether the error signal is converged.

107. If the convergence detector determines that the error signal is converged, control the subtractor to generate a simulation signal according to the adaptive filtering signal and output the simulation signal.

Specifically, an implementation method in which the convergence detector controls the subtractor to generate a simulation signal according to the adaptive filtering signal may be: when there is only a single adaptive filtering signal, controlling the subtractor to directly output the single adaptive signal as a simulation signal; and when there are multiple adaptive filtering signals, performing addition calculation on the multiple adaptive filtering signals to obtain a simulation signal.

Figure 4:
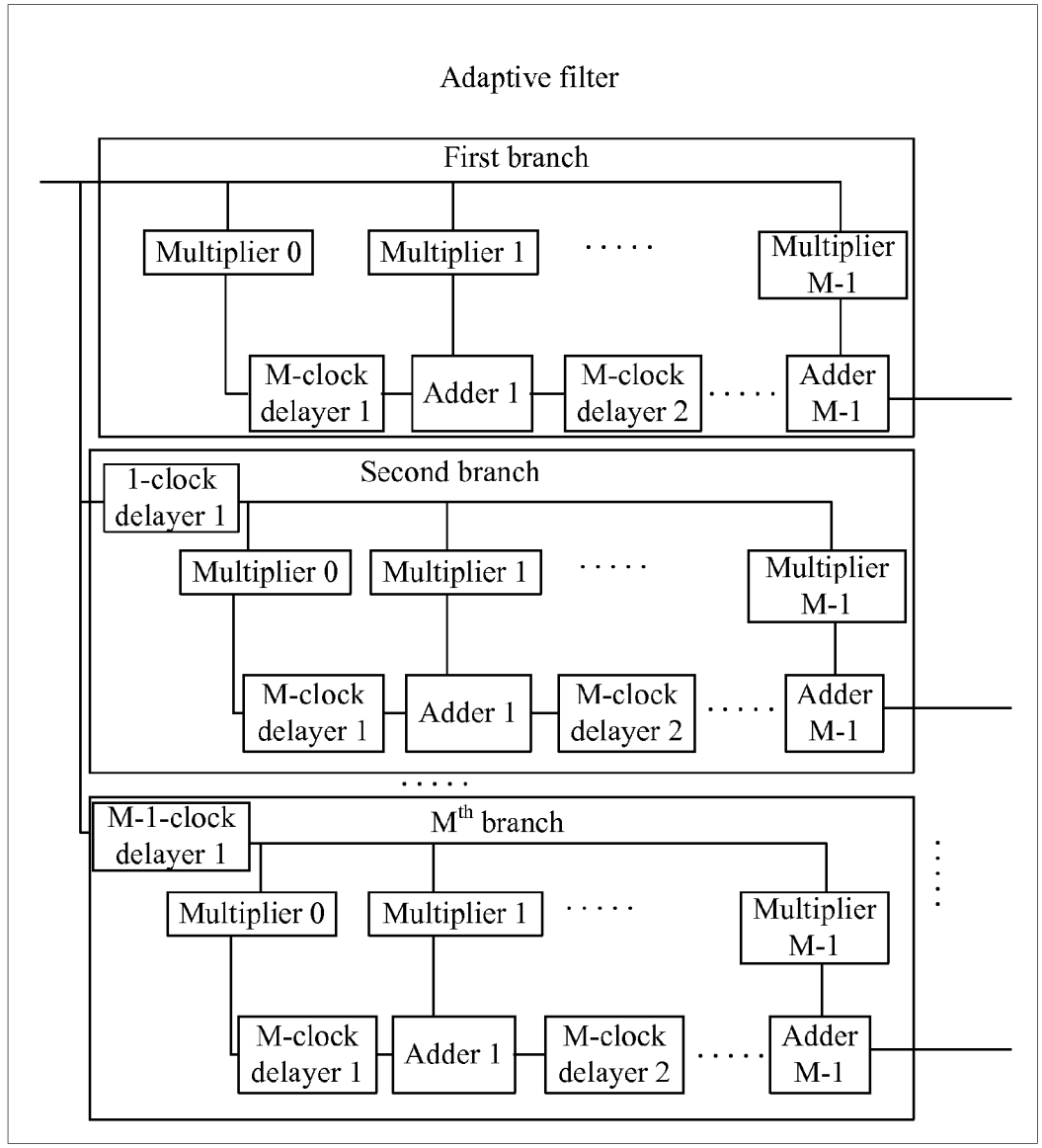
FIG. 4 is a composition block diagram of an adaptive filter according to the present invention.

In addition, it should be noted that this embodiment of the present invention provides an adaptive filter, and a structure of the adaptive filter is shown in FIG. 4. The filter has L branches that include a first branch to an $L^{th}$ branch, and each branch has one ingress port and one egress port, where L is a positive integer.

When L is equal to 1, M multipliers, M−1 adders, and M−1 M-clock delayers are disposed in the $L^{th}$ branch, where the M multipliers are a multiplier 0 to a multiplier M−1, the M−1 adders are an adder 1 to an adder M−1, and the M−1 M-clock delayers are an M-clock delayer 1 to an M-clock delayer M−1; each delayer has one ingress port and one egress port, each multiplier has one ingress port and one egress port, and each adder has two ingress ports and one egress port; M is a positive integer; and an ingress port of the $L^{th}$ branch is connected to ingress ports of the multiplier 0 to the multiplier M−1, an egress port of the multiplier 0 is connected to an ingress port of the M-clock delayer 1, an egress port of each of a multiplier 1 to the multiplier M−1 is connected to one ingress port of each of the adder 1 to the adder M−1, and an egress port of each of the M-clock delayer 1 to the M-clock delayer M−1 is connected to the other ingress port of each of the adder 1 to the adder M−1.

Then, the receiving, by an adaptive filter, an input signal, performing adaptive filtering processing on the input signal according to an adaptive filtering weight currently stored in the adaptive filter, so as to obtain an adaptive filtering signal includes:

in the $L^{th}$ branch, receiving, by each of the multiplier 0 to the multiplier M−1, the input signal through the ingress port of the $L^{th}$ branch, and performing multiplication on the input signal according to an adaptive filtering weight stored in each of the multipliers, to obtain a multiplier output signal generated by each of the multiplier 0 to the multiplier M−1; outputting, by each of the multiplier 0 to the multiplier M−1 through an egress port of each of the multiplier 0 to the multiplier M−1, the multiplier output signal generated by each of the multiplier 0 to the multiplier M−1; performing, by each of the M-clock delayer 1 to the M-clock delayer M−1, M-clock delay processing on a signal received at an ingress port of each of the M-clock delayer 1 to the M-clock delayer M−1, to obtain an M-clock delay signal generated by each of the M-clock delayer 1 to the M-clock delayer M−1; outputting, by each of the M-clock delayer 1 to the M-clock delayer M−1 through the egress port of each of the M-clock delayer 1 to the M-clock delayer M−1, the M-clock delay signal generated by each of the M-clock delayer 1 to the M-clock delayer M−1; performing, by the adder 1 to the adder M−1, addition processing on signals received through two ingress ports corresponding to each of the adder 1 to the adder M−1, to obtain an adder output signal generated by each of the adder 1 to the adder M−1; and outputting, by each of the adder 1 to the adder M−1 through an egress port corresponding to each of the adder 1 to the adder M−1, the adder output signal generated by each of the adder 1 to the adder M−1.

When L is greater than 1, one (L−1)-clock delayer, M multipliers, M−1 adders, and M−1 M-clock delayers are disposed in the $L^{th}$ branch, where the M multipliers are a multiplier 0 to a multiplier M−1, the M−1 adders are an adder 1 to an adder M−1, and the M−1 M-clock delayers are an M-clock delayer 1 to an M-clock delayer M−1; each delayer has one ingress port and one egress port, each multiplier has one ingress port and one egress port, and each adder has two ingress ports and one egress port; and in the $L^{th}$ branch, an ingress port of the $L^{th}$ branch is connected to an ingress port of the (L−1)-clock delayer, an egress port of the (L−1)-clock delayer is connected to ingress ports of all multipliers, an egress port of the multiplier 0 is connected to an ingress port of the M-clock delayer 1, an egress port of each of a multiplier 1 to the multiplier M−1 is connected to one ingress port of each of the adder 1 to the adder M−1, and an egress port of each of the M-clock delayer 1 to the M-clock delayer M−1 is connected to the other ingress port of each of the adder 1 to the adder M−1.

Then, the receiving, by an adaptive filter, an input signal, performing adaptive filtering processing on the input signal according to an adaptive filtering weight currently stored in the adaptive filter, so as to obtain an adaptive filtering signal includes: in the $L^{th}$ branch, receiving, by the (L−1)-clock delayer, the input signal through the ingress port of the (L−1)-clock delayer, and performing (L−1)-clock delay processing on the input signal to generate an (L−1)-clock delay signal; outputting, by the (L−1)-clock delayer, the (L−1)-clock delay signal through the egress port of the (L−1)-clock delayer; receiving, by each of the multiplier 0 to the multiplier M−1, the (L−1)-clock delay signal through the ingress port of the $L^{th}$ branch, and performing multiplication on the (L−1)-clock delay signal according to an adaptive filtering weight stored in each of the multipliers, to obtain a multiplier output signal generated by each of the multiplier 0 to the multiplier M−1; outputting, by each of the multiplier 0 to the multiplier M−1 through an egress port of each of the multiplier 0 to the multiplier M−1, the multiplier output signal generated by each of the multiplier 0 to the multiplier M−1; performing, by each of the M-clock delayer 1 to the M-clock delayer M−1, M-clock delay processing on a signal received at an ingress port of each of the M-clock delayer 1 to the M-clock delayer M−1, to obtain a delay signal generated by each of the M-clock delayer 1 to the M-clock delayer M−1; outputting, by each of the M-clock delayer 1 to the M-clock delayer M−1 through the egress port of each of the M-clock delayer 1 to the M-clock delayer M−1, the delay signal generated by each of the M-clock delayer 1 to the M-clock delayer M−1; performing, by each of the adder 1 to the adder M−1, addition processing on signals received through two ingress ports corresponding to each of the adder 1 to the adder M−1, to obtain an adder output signal generated by each of the adder 1 to the adder M−1; and outputting, by each of the adder 1 to the adder M−1 through an egress port corresponding to each of the adder 1 to the adder M−1, the adder output signal generated by each of the adder 1 to the adder M−1.

Certainly, this embodiment of the present invention is not limited to that only a structure of the foregoing adaptive filter can be used to implement an adaptive filtering method based on an error sub-band, and a FIR filter commonly used in the technical field may also be used to implement the adaptive filtering method based on an error sub-band.

Figure 5:
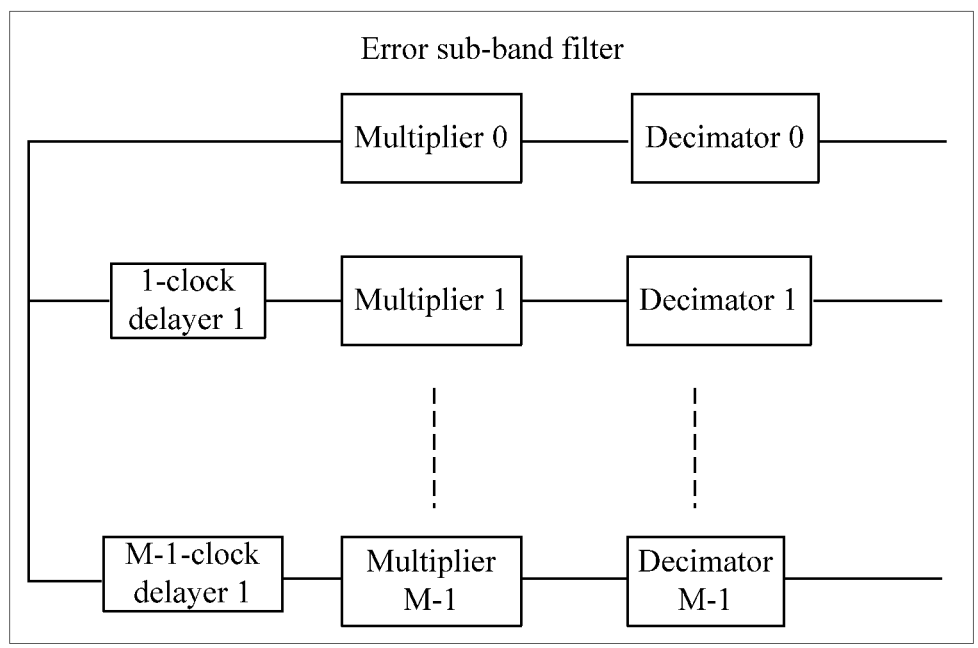
FIG. 5 is a composition block diagram of an error sub-band filter according to the present invention.

This embodiment of the present invention further provides an error sub-band filter, and a structure of the error sub-band filter is shown in FIG. 5. The filter has N branches that include a first branch to an $N^{th}$ branch, and each branch has one ingress port and one egress port, where N is a positive integer.

When X is equal to 1, one low-pass filter, one multiplier X−1, and one decimator X−1 are disposed in an $X^{th}$ branch; an ingress port of the low-pass filter is connected to an ingress port of the $X^{th}$ branch, an egress port of the low-pass filter is connected to an ingress port of the multiplier X−1, an egress port of the multiplier X−1 is connected to the decimator X−1, and an egress port of the decimator X−1 is connected to an egress port of the $X^{th}$ branch.

Then, the receiving, by the error sub-band filter, the error signal, performing sub-band analysis filtering processing on the error signal to obtain an error sub-band signal includes: receiving, by the low-pass filter, the error signal through the ingress port of the low-pass filter, and performing filtering processing on the error signal according to band-pass setting of the low-pass filter to obtain a low-pass filter signal; outputting, by the low-pass filter, the low-pass filter signal through the egress port of the low-pass filter; performing, by the multiplier X−1 according to a weight stored in the multiplier X−1, multiplication processing on a signal received through the ingress port of the multiplier X−1, to obtain a multiplier output signal; outputting, by the multiplier X−1, the multiplier output signal through the egress port of the multiplier X−1; performing, by the decimator X−1, X times down sampling processing on a signal received through an ingress port of the decimator X−1, to obtain an error sub-band signal of the $X^{th}$ branch; and outputting, by the decimator X−1, the error sub-band signal of the $X^{th}$ branch through the egress port of the decimator X−1.

When X is greater than 1 and less than N−1, one band-pass filter, one (X−1)-clock delayer, one multiplier X−1, and one decimator X−1 are disposed in an $X^{th}$ branch; an ingress port of the band-pass filter is connected to an ingress port of the $X^{th}$ branch, an egress port of the band-pass filter is connected to an ingress port of the (X−1)-clock delayer, an egress port of the (X−1)-clock delayer is connected to an ingress port of the multiplier X−1, an egress port of the multiplier X−1 is connected to the decimator X−1, and an egress port of the decimator X−1 is connected to an egress port of the $X^{th}$ branch.

Then, the receiving, by the error sub-band filter, the error signal, performing sub-band analysis filtering processing on the error signal to obtain an error sub-band signal includes: receiving, by the band-pass filter, the error signal through the ingress port of the band-pass filter, and performing filtering processing on the error signal according to band-pass setting of the band-pass filter to obtain a band-pass filter signal; outputting, by the band-pass filter, the band-pass filter signal through the egress port of the band-pass filter; performing, by the (X−1)-clock delayer, (X−1)-clock delay processing on a signal received through the ingress port of the (X−1)-clock delayer, to obtain a delay signal; outputting, by the (X−1)-clock delayer, the delay signal through the egress port of the (X−1)-clock delayer; performing, by the multiplier X−1 according to a weight stored in the multiplier X−1, multiplication processing on a signal received through the ingress port of the multiplier X−1, to obtain a multiplier output signal; outputting, by the multiplier X−1, the multiplier output signal through the egress port of the multiplier X−1; performing, by the decimator X−1, X times down sampling processing on a signal received through an ingress port of the decimator X−1, to obtain an error sub-band signal of the $X^{th}$ branch; and outputting, by the decimator X−1, the error sub-band signal of the $X^{th}$ branch through the egress port of the decimator X−1.

When X is equal to N, one high-pass filter, one (X−1)-clock delayer, one multiplier X−1, and one decimator X−1 are disposed in an $X^{th}$ branch; an ingress port of the high-pass filter is connected to an ingress port of the $X^{th}$ branch, an egress port of the high-pass filter is connected to an ingress port of the (X−1)-clock delayer, an egress port of the (X−1)-clock delayer is connected to an ingress port of the multiplier X−1, an egress port of the multiplier X−1 is connected to the decimator X−1, and an egress port of the decimator X−1 is connected to an egress port of the $X^{th}$ branch.

Then, the receiving, by the error sub-band filter, the error signal, performing sub-band analysis filtering processing on the error signal to obtain an error sub-band signal includes: receiving, by the high-pass filter, the error signal through the ingress port of the high-pass filter, and performing filtering processing on the error signal according to high-pass setting of the high-pass filter to obtain a high-pass filter signal; outputting, by the high-pass filter, the high-pass filter signal through the egress port of the high-pass filter; performing, by the (X−1)-clock delayer, (X−1)-clock delay processing on a signal received through the ingress port of the (X−1)-clock delayer, to obtain a delay signal; outputting, by the (X−1)-clock delayer, the delay signal through the egress port of the (X−1)-clock delayer; performing, by the multiplier X−1 according to a weight stored in the multiplier X−1, multiplication processing on a signal received through the ingress port of the multiplier X−1, to obtain a multiplier output signal; outputting, by the multiplier X−1, the multiplier output signal through the egress port of the multiplier X−1; performing, by the decimator X−1, X times down sampling processing on a signal received through an ingress port of the decimator X−1, to obtain an error sub-band signal of the $X^{th}$ branch; and outputting, by the decimator X−1, the error sub-band signal of the $X^{th}$ branch through the egress port of the decimator X−1.

Certainly, this embodiment of the present invention is not limited to that only a structure of the foregoing error sub-band filter can be used to implement an adaptive filtering method based on an error sub-band, and a sub-band analysis filter commonly used in the technical field may also be used to implement the adaptive filtering method based on an error sub-band.

In addition, a structure of the input signal analysis filter is similar to the structure of the error sub-band filter, and a method for analysis filtering processing on an input signal is also similar to a method of processing an error signal by the error sub-band filter, which is not described in detail in this embodiment of the present invention.

According to the adaptive filtering method that is based on an error sub-band and provided in this embodiment of the present invention, analysis filtering processing is performed on an error signal and an input signal to obtain an error sub-band signal and an input sub-band signal respectively; calculation is performed according to the input sub-band signal and the error sub-band signal to obtain a new adaptive filtering weight, and a weight in an adaptive filter is updated, so that when the adaptive filter works, the adaptive filter may directly use an updated weight to perform adaptive filter processing on the input signal, so as to obtain an adaptive filtering signal. Compared with a technical solution in the prior art, in which analysis filtering processing needs to be first performed on an input signal, and a processing result is input to an adaptive filter to perform adaptive processing to obtain an adaptive filtering sub-band signal, and then an adaptive filtering signal can be obtained by performing integrated filtering processing on the adaptive filtering sub-band signal, in the present invention, a processing result of an adaptive filter does not need to be restored; compared with the technical solution provided in the prior art, an integrated filter for signal reconstruction is omitted, thereby reducing the amount of calculation of an adaptive filtering algorithm.

Embodiment 2

Figure 6:
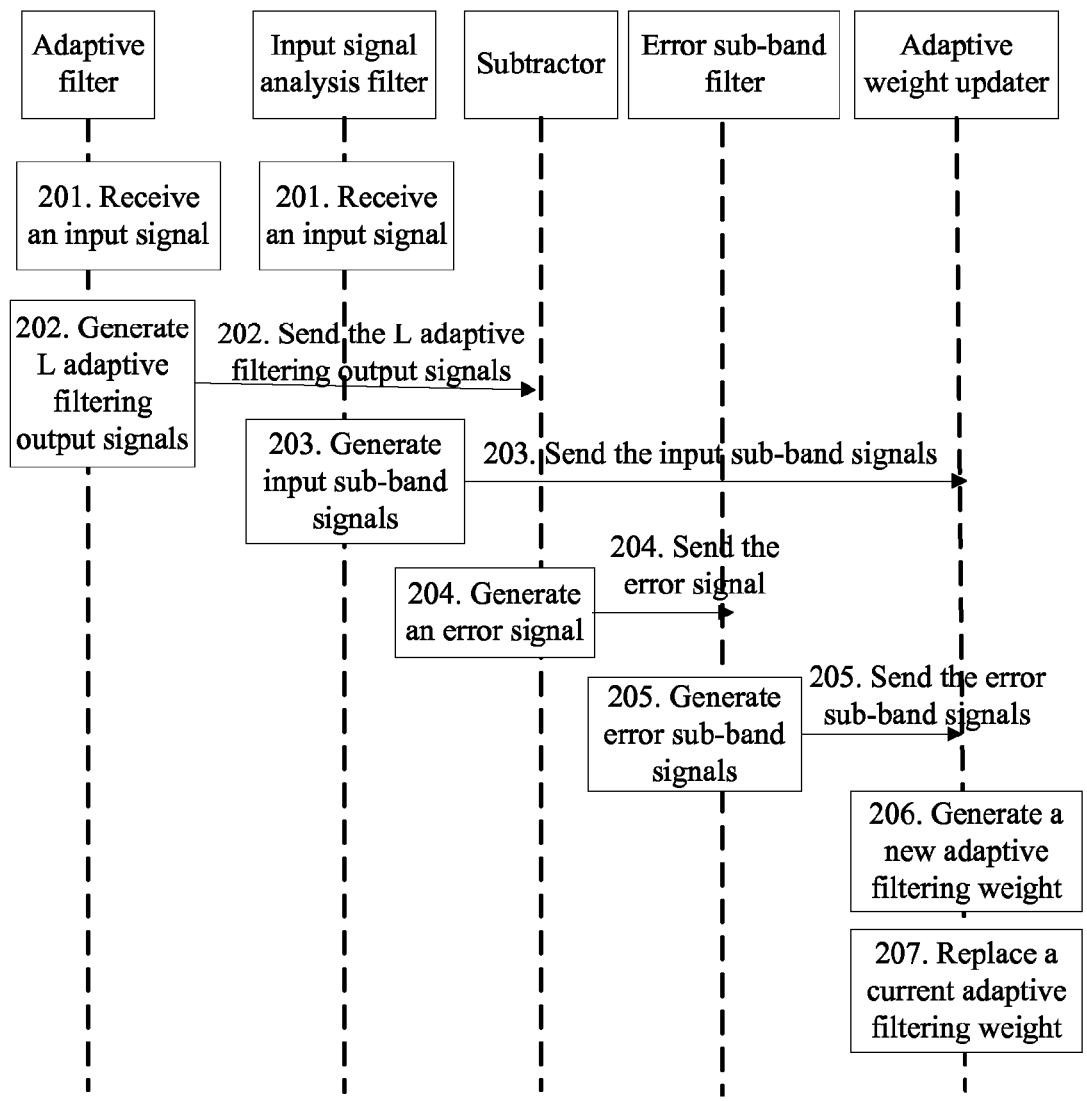
FIG. 6 is a flowchart of an adaptive filtering method based on an error sub-band according to Embodiment 2 of the present invention.

Based on a description of a system architecture shown in FIG. 1, that the number of sub-bands is 2 is used as an example in this embodiment of the present invention to specifically describe an adaptive filtering method that is based on an error sub-band and provided in this embodiment of the present invention. As shown in FIG. 6, the method includes the following steps.

201. An adaptive filter and an input signal analysis filter receive an input signal x(n).

202. The adaptive filter performs adaptive filtering processing on x(n) according to a current adaptive filtering weight to generate L adaptive filtering output signals $y_0(n)$, $y_1(n), \ldots,$ and $y_L(n)$, and transmits $y_0(n), y_1(n), \ldots,$ and $y_L(n)$ to a subtractor.

L is the number of taps of the adaptive filter.

203. The input signal analysis filter performs sub-band analysis filtering processing on x(n) to obtain four input sub band signals $x_{00}(n)$, $x_{01}(n)$, $x_{10}(n)$, and $x_{11}(n)$, and transmits $x_{00}(n), x_{01}(n), x_{10}(n), x_{11}(n)$, and $x_1(n)$ to an adaptive weight updater.

204. The subtractor receives $y_0(n), y_1(n), \ldots,$ and $y_L(n)$ and a reference signal d(n), obtains a difference between $$\sum_{i=0}^{L} y_i(n)$$

and d(n) as an error signal e(n), and transmits e(n) to an error sub-band filter.

205. The error sub-band filter performs analysis filtering processing on e(n) to obtain two error sub-band signals $e_0(n)$ and $e_1(n)$, and transmits $e_0(n)$ and $e_1(n)$ to the adaptive weight updater.

206. The adaptive weight updater obtains a new adaptive filtering weight according to $x_{00}(n)$, $x_{01}(n)$, $x_{10}(n)$, $x_{11}(n)$, $e_0(n)$, and $e_1(n)$ with reference to the following formula 2:

$$\hat{s}_{0k}(n+1) = \hat{s}_{0k}(n) + 2\mu[\alpha_0 e_0(n)x_{00}(n-k) + \alpha_1 e_1(n)x_{10}(n-k)]$$

$$\hat{s}_{1k}(n+1) = \hat{s}_{1k}(n) + 2\mu[\alpha_0 e_0(n)x_{01}(n-k) + \alpha_1 e_1(n)x_{11}(n-k)] \quad \text{(Formula b)}$$

where k is equal to 0, 1, . . . , or $$\frac{L}{2} - 1.$$

207. The adaptive weight updater replaces the current adaptive filtering weight in the adaptive filter with the new adaptive filtering weight.

In this embodiment, a derivation process of a weight coefficient update formula, that is, the formula b is specifically as follows:

A cost function of an adaptive filtering algorithm is assumed as:

$$J = E\{\alpha_0 e_0^2(n) + \alpha_1 e_1^2(n)\} \quad (1)$$

then, the weight coefficient update formula can be expressed as:

$$\hat{S}_m(n+1) = \hat{S}_m(n) - \mu \frac{\partial J}{\partial \hat{S}_m(n)} m = 0, 1 \quad (2)$$

where $\hat{S}_m(n) = [\hat{s}_{m,1}, \hat{s}_{m,2}, \ldots, \hat{s}_{m,k}]^T$, k=1, 2, . . . , L/2−1, and in the formula, L is a tap coefficient of a filter; and $$\frac{\partial J}{\partial \hat{S}_m(n)} = E\left\{2\alpha_0 e_0(n)\frac{\partial e_0(n)}{\partial \hat{S}_m(n)} + 2\alpha_1 e_1(n)\frac{\partial e_1(n)}{\partial \hat{S}_m(n)}\right\}, m = 1, 2 \quad (3)$$

A transfer function of the adaptive filter is:

$$\hat{S}(z) = \hat{S}_0(z^2) + z^{-1}\hat{S}_1(z^2) \quad (4)$$

a signal output by a filter is:

$$Y(z) = X(z)\hat{S}(z) = X(z)\hat{S}_0(z^2) + X(z)z^{-1}\hat{S}_1(z^2) \quad (5)$$

an error signal is:

$$E(z) = D(z) - Y(z) \quad (6)$$

according to a relationship between input and output of the error sub-band filter, the following may be obtained:

$$E_0(z) = \frac{1}{2}[E(z^{1/2})H_0(z^{1/2}) + E(-z^{1/2})H_0(-z^{1/2})] \quad (7)$$

$$E_1(z) = \frac{1}{2}[E(z^{1/2})H_1(z^{1/2}) + E(-z^{1/2})H_1(-z^{1/2})]$$

$$E_0(z) = \frac{1}{2}\{[D(z^{1/2}) + D(-z^{1/2})]H_0(z^{1/2}) - \quad (8)$$
$$\hat{S}_0(z)[X(z^{1/2})H_0(z^{1/2}) + X(-z^{1/2})H_0(-z^{1/2})] -$$
$$\hat{S}_1(z)[X(z^{1/2})z^{-1/2}H_0(z^{1/2}) + X(-z^{1/2})(-z^{-1/2})H_0(-z^{1/2})]\}$$

$$E_1(z) = \frac{1}{2}\{[D(z^{1/2}) + D(-z^{1/2})]H_1(z^{1/2}) - \quad (9)$$
$$\hat{S}_0(z)[X(z^{1/2})H_1(z^{1/2}) + X(-z^{1/2})H_1(-z^{1/2})] -$$
$$\hat{S}_1(z)[X(z^{1/2})z^{-1/2}H_1(z^{1/2}) + X(-z^{1/2})(-z^{-1/2})H_1(-z^{1/2})]\}$$

because $$\frac{\partial E(z^{1/2})}{\partial \hat{S}_0(z)} = -X(z^{1/2}) \quad (10)$$

$$\frac{\partial E(-z^{1/2})}{\partial \hat{S}_0(z)} = -X(-z^{1/2}), \quad (11)$$

-continued $$\frac{\partial E_0(z)}{\partial \hat{S}_0(z)} = -\frac{1}{2}[X(z^{1/2})H_0(z^{1/2}) + X(-z^{1/2})H_0(-z^{1/2})] \quad (12)$$

$$\frac{\partial E_1(z)}{\partial \hat{S}_0(z)} = -\frac{1}{2}[X(z^{1/2})H_1(z^{1/2}) + X(-z^{1/2})H_1(-z^{1/2})]$$

$$\frac{\partial E_0(z)}{\partial \hat{S}_1(z)} = -\frac{1}{2}[X(z^{-1/2})z^{1/2}H_0(z^{1/2}) + X(-z^{-1/2})(-z^{-1/2})H_0(-z^{1/2})]$$

$$\frac{\partial E_1(z)}{\partial \hat{S}_1(z)} = -\frac{1}{2}[X(z^{-1/2})z^{1/2}H_1(z^{1/2}) + X(-z^{-1/2})(-z^{-1/2})H_1(-z^{1/2})]$$

assuming $X'_{00} = -\frac{\partial E_0(z)}{\partial \hat{S}_0(z)}$, $X'_{10} = -\frac{\partial E_1(z)}{\partial \hat{S}_0(z)}$, $X'_{01} = -\frac{\partial E_0(z)}{\partial \hat{S}_1(z)}$, and $X'_{11} = -\frac{\partial E_1(z)}{\partial \hat{S}_1(z)}$, $$\frac{\partial E_0(z)}{\partial \hat{S}_{0k}(z)} = -X'_{00}z^{-K} \quad (13)$$

$$\frac{\partial E_1(z)}{\partial \hat{S}_{0k}(z)} = -X'_{10}z^{-K}$$

$$\frac{\partial E_0(z)}{\partial \hat{S}_{1k}(z)} = -X'_{10}z^{-K}$$

$$\frac{\partial E_1(z)}{\partial \hat{S}_{1k}(z)} = -X'_{11}z^{-K}$$

formulas (8) and (9) may be written as:

$$E_0(z) = \frac{1}{2}[D(z^{1/2}) + D(-z^{1/2})]H_0(z^{1/2}) - \hat{S}_0(z)X'_{00}(z) - \hat{S}_1(z)X'_{01}(z) \quad (14)$$

$$E_1(z) = \frac{1}{2}[D(z^{1/2}) + D(-z^{1/2})]H_0(z^{1/2}) - \hat{S}_0(z)X'_{10}(z) - \hat{S}_1(z)X'_{11}(z)$$

with reference to (14) (13) and (12), (2) may be rewritten as:

$$\hat{s}_{0k}(n+1) = \quad (15)$$
$$\hat{s}_{0k}(n) + 2\mu[\alpha_0 E\{e_0(n)x_{00}(n-k)\} + \alpha_1 E\{e_1(n)x_{10}(n-k)\}]$$

$$\hat{s}_{1k}(n+1) = \hat{s}_{1k}(n) + $$
$$2\mu[\alpha_0 E\{e_0(n)x_{01}(n-k)\} + \alpha_1 E\{e_1(n)x_{11}(n-k)\}]$$

$$k = 1, 2, \ldots, \frac{L}{2} - 1$$

a weight update formula of an LMS algorithm may be obtained by replacing a reference value with an instantaneous value:

$$\hat{s}_{0k}(n+1) = \hat{s}_{0k}(n) + 2\mu[\alpha_0 e_0(n)x_{00}(n-k) + \alpha_1 e_1(n)x_{10}(n-k)]$$

$$\hat{s}_{1k}(n+1) = \hat{s}_{1k}(n) + 2\mu[\alpha_0 e_0(n)x_{01}(n-k) + \alpha_1 e_1(n)x_{11}(n-k)] \quad (16)$$

according to formulas (13) and (12) the following may be obtained:

$$X'_{00}(z) = \frac{1}{2}[X(z^{1/2})H_0(z^{1/2}) + X(-z^{1/2})H_0(-z^{1/2})] \quad (17)$$

$$X'_{10}(z) = \frac{1}{2}[X(z^{1/2})H_1(z^{1/2}) + X(-z^{1/2})H_1(-z^{1/2})]$$

$$X'_{01}(z) = \frac{1}{2}[X(z^{-1/2})z^{1/2}H_0(z^{1/2}) + X(-z^{-1/2})(-z^{-1/2})H_0(-z^{1/2})]$$

$$X'_{11}(z) = \frac{1}{2}[X(z^{-1/2})z^{1/2}H_1(z^{1/2}) + X(-z^{-1/2})(-z^{-1/2})H_1(-z^{1/2})]$$

In this embodiment, a derivation process for convergence of the adaptive filtering algorithm includes the following:

multiphase decomposition is performed on a transfer function S(z) of a real channel; then, a reference signal may be expressed as:

$$D(z) = X(z)S_0(z) + X(z)z^{-1}S_1(z) \quad (18)$$

formula (6) may be written as:

$$E(z) = X(z)[S_0(z^2) - \hat{S}_0(z^2)] + X(z)[z^{-1}S_1(z^2) - z^{-1}\hat{S}_1(z^2)] \quad (19)$$

assuming $V_0(z) = S_0(z) - \hat{S}_0(z)$ and $V_1(z) = S_1(z) - \hat{S}_1(z)$, the foregoing formula may be rewritten as:

$$E(z) = X(z)V_0(z^2) + X(z)z^{-1}V_1(z^2) \quad (20)$$

which is substituted into (7), the following is obtained:

$$E_0(z) = x_{00}(z)V_0(z) + x_{01}(z)V_0(z)$$

$$E_1(z) = X_{10}(z)V_0(z) + X_{11}(z)V_1(z) \quad (21)$$

a time-domain expression of (21) is:

$$e_0(n) = x_{00}^T(n)v_0(n) + x_{01}^T(n)v_1(n)$$

$$e_1(n) = x_{10}^T(n)v_0(n) + x_{11}^T(n)v_1(n) \quad (22)$$

where $x_{lk}^T = [x_{lk}(n), x_{lk}(n-1), \ldots, x_{lk}(n-L/2+1)]$, $l,k=1,2$;

the following may be obtained by substituting the foregoing formula into the weight update formula (16):

$$v_0(n+1) = v_0(n) - 2\mu\alpha_0 x_{00}(n)x_{00}^T(n)v_0(n) - 2\mu\alpha_0 x_{00}(n)$$
$$x_{01}^T(n)v_1(n) - 2\mu\alpha_1 x_{10}(n)x_{10}^T(n)v_0(n) - 2\mu\alpha_1 x_{10}(n)$$
$$x_{11}^T(n)v_1(n) \quad (23)$$

$$v_1(n+1) = v_1(n) - 2\mu\alpha_0 x_{01}(n)x_{00}^T(n)v_0(n) - 2\mu\alpha_0 x_{01}(n)$$
$$x_{01}^T(n)v_1(n) - 2\mu\alpha_1 x_{11}(n)x_{10}^T(n)v_0(n) - 2\mu\alpha_1 x_{11}(n)$$
$$x_{11}^T(n)v_1(n) \quad (24)$$

(23) and (24) are expressed in a form of a vector as follows:

$$\begin{bmatrix} v_0(n+1) \\ v_1(n+1) \end{bmatrix} = \begin{bmatrix} v_0(n) \\ v_1(n) \end{bmatrix} - 2\mu[\alpha_0 A_0 + \alpha_1 A_1]\begin{bmatrix} v_0(n) \\ v_1(n) \end{bmatrix} \quad (25)$$

where $$A_0 = \begin{bmatrix} x_{00}(n)x_{00}^T(n) & x_{00}(n)x_{01}^T(n) \\ x_{01}(n)x_{00}^T(n) & x_{01}(n)x_{01}^T(n) \end{bmatrix} \quad (26)$$

$$A_1 = \begin{bmatrix} x_{10}(n)x_{10}^T(n) & x_{10}(n)x_{11}^T(n) \\ x_{11}(n)x_{10}^T(n) & x_{11}(n)x_{11}^T(n) \end{bmatrix} \quad (27)$$

for (25), an average value is taken as follows:

$$E\begin{bmatrix} v_0(n+1) \\ v_1(n+1) \end{bmatrix} = E\begin{bmatrix} v_0(n) \\ v_1(n) \end{bmatrix} - 2\mu E[\alpha_0 A_0 + \alpha_1 A_1]E\begin{bmatrix} v_0(n) \\ v_1(n) \end{bmatrix} \quad (28)$$

assuming $\Phi = E[\alpha_0 A_0 + \alpha_1 A_1]$, the foregoing formula may be rewritten as the following classic:

$$\epsilon(n+1) = [1 - 2\mu\Phi]\epsilon(n) \quad (29)$$

in this case, $x_{00}(n)$, $x_{01}(n)$, $x_{10}(n)$, and $x_{11}(n)$ are analytical components of x and have different spectral components, and an inner product of $x_{00}(n)$, $x_{01}(n)$, $x_{10}(n)$, and $x_{11}(n)$ is zero;

therefore, $x_{00}(n)$, $x_{01}(n)$, $x_{10}(n)$, and $x_{11}(n)$ are not correlated. Then, it may be learned that $A_0$, $A_1$, and $\Phi$ are positive definite diagonal matrixes.

A sketch value of $\Phi$ is assumed as:

$$\lambda_1 \leq \lambda_2 \leq \ldots \leq \lambda_L \quad (30)$$

then, a condition for convergence of the adaptive filtering algorithm is:

$$0 < \mu < \frac{1}{\lambda_L} \quad (31)$$

In this embodiment, description is made only by assuming that the number of sub-bands is 2; however, an adaptive filtering algorithm that is based on an error sub-band and provided in this embodiment of the present invention is not limited to processing based on only two sub-bands. If the number of sub-bands is expanded to M, a convergence condition of the adaptive filtering algorithm is as follows:

First, M-group multiphase decomposition is performed on an estimation filter $\hat{S}(z)$:

$$\hat{S}(z) = \hat{S}_0(z^M) + z^{-1}\hat{S}_2(z^M) + \ldots + z^{-M+1}\hat{S}_{M-1}(z^M) \quad (32)$$

in this case, a cost function is:

$$J(n) = E\{\alpha_0 e_0^2(n) + \alpha_1 e_1^2(n) + \ldots + \alpha_{M-1} e_{M-1}^2(n)\} \quad (33)$$

and a weight update formula of $\hat{S}(z)$ is:

$$\hat{s}_{ki}(n+1) = \hat{s}_{ki}(n) + 2\mu \sum_{l=0}^{M-1} \alpha_l e_l(n) x_{lk}(n-i) \quad (34)$$

$$k = 0, 1, \ldots, (M-1)$$

$$i = 0, 1, \ldots, \left(\frac{L}{M} - 1\right)$$

L is the number of taps of $\hat{S}(z)$. (28) may be expanded as:

$$E\begin{bmatrix} v_0(n+1) \\ v_1(n+1) \\ \vdots \\ v_{M-1}(n+1) \end{bmatrix} = [I_L - 2\mu\Phi]E\begin{bmatrix} v_0(n) \\ v_1(n) \\ \vdots \\ v_{M-1}(n) \end{bmatrix} \quad (35)$$

$$\Phi = \alpha_0 \Phi_0 + \alpha_1 \Phi_1 + \ldots + \alpha_{M-1} \Phi_{M-1} \quad (36)$$

where $$\Phi_k = E\left(\begin{bmatrix} x_{k0}(n) \\ x_{k1}(n) \\ \vdots \\ x_{k,M-1}(n) \end{bmatrix} [x_{k0}^T(n) \ x_{k1}^T(n) \ \ldots \ x_{k,M-1}^T(n)]\right) \quad (37)$$

$$k = 0, 1, \ldots, (M-1)$$

in this case, a convergence condition is:

$$1 < \mu < \frac{1}{\lambda_{max}} \quad (38)$$

for ease of description, it is assumed herein that a length of $\hat{S}(n)$ is 8, and the number of sub-bands is 4.

$$\Phi = \sum_{k=0}^{3} \alpha_k \Phi_k \quad (39)$$

$$\Phi = \left(\begin{bmatrix} x_{k0} \\ x_{k1} \\ x_{k2} \\ x_{k3} \end{bmatrix} [x_{k0}^T \ x_{k1}^T \ x_{k2}^T \ x_{k3}^T]\right) \quad (40)$$

where $$x_{kl}(n) = [b_k(l+4n)b_k(l+4n+4)]^T \quad (41)$$

assuming $r_k(m) = E[b_k(n)b_k(n+m)] \quad (42)$, $$\Phi_k = \begin{bmatrix} r_k(0) & r_k(4) & r_k(1) & r_k(5) & r_k(2) & r_k(6) & r_k(3) & r_k(7) \\ r_k(4) & r_k(0) & r_k(3) & r_k(1) & r_k(2) & r_k(2) & r_k(1) & r_k(3) \\ r_k(1) & r_k(3) & r_k(0) & r_k(4) & r_k(1) & r_k(5) & r_k(2) & r_k(6) \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ r_k(7) & r_k(3) & r_k(6) & r_k(2) & r_k(5) & r_k(1) & r_k(4) & r_k(0) \end{bmatrix} \quad (43)$$

Herein, it is assumed that transfer functions of four branches of the error sub-band filter are $H_0(e^{j\omega})$, $H_1(e^{j\omega})$, $H_2(e^{j\omega})$, and $H_3(e^{j\omega})$, whose bandwidth are $\pi/4$. Assuming that a passband of $H(e^{j\omega})$ is $[-\pi/8, \pi/8]$ and a passband gain is 1, a group of filters may be obtained by translation of the filter.

$$H_k(e^{j\omega}) = H(e^{j(\omega-\omega_k)}) + H(e^{j(\omega+\omega_k)}) \quad (44)$$

where $$\omega_k = (2k+1)(\pi/8), k = 0, 1, 2, 3 \quad (45)$$

A power spectrum density function of $x(n)$ is assumed as:

$$P_x(e^{j\omega}) = \sum_{k=0}^{3} r_k(P(e^{j(\omega-\omega_k)}) + P(e^{j(\omega+\omega_k)})) \quad (46)$$

where a gain of $P(e^{j\omega})$ in bandwidth is 1, and the bandwidth is $[-\pi/8, \pi/8]$.

Then, a power spectrum function of $b(n)$ is:

$$P_k(e^{j\omega}) = P_x(e^{j\omega})\{|H(e^{j(\omega-\omega_k)})|^2 + |H(e^{j(\omega-\omega_k)})|^2\} \quad (47)$$

$P(e^{j\omega})$ and $H(e^{j\omega})$ have a same property, and therefore (47) may also be written as:

$$P_k(e^{j\omega}) = P_x(e^{j\omega})r_k(P(e^{j(\omega-\omega_k)}) + P(e^{j(\omega+\omega_k)})) \quad (48)$$

inverse Fourier transform is performed on the foregoing formula:

$$r_k(n) = 2r_k p(n)\cos(\omega_k n) \quad (49)$$

$p(n)$ is inverse Fourier transform of $P(e^{j\omega})$.

Assuming $$q(n) = \sum_{k=0}^{3} \alpha_k r_k(n) \quad (50)$$

then $$\Phi = \begin{bmatrix} q(0) & q(4) & q(1) & q(5) & q(2) & q(6) & q(3) & q(7) \\ q(4) & q(0) & q(3) & q(1) & q(2) & q(2) & q(1) & q(3) \\ q(1) & q(3) & q(0) & q(4) & q(1) & q(5) & q(2) & q(6) \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ q(7) & q(3) & q(6) & q(2) & q(5) & q(1) & q(4) & q(0) \end{bmatrix} \quad (51)$$

assuming $\alpha_k$ is equal to $c/r_k$, then $$q(n) = 2cp(n)\sum_{k=0}^{3}\cos(\omega_k n) \quad (52)$$

Because $\omega_k=(2k+1)/(\pi/8)$, k=0, 1, 2, 3, when n=8m, m= . . . −2, −1, 0, 1, 2, . . . , $$\sum_{k=0}^{3}\cos(\omega_k n)$$

is not equal to 0; further, because a sine function P(n) is equal to 0 when n=8m, m= . . . −2, −1, 1, 2, . . . , q(n) is not equal to 0 only when n=0; then, Φ=q(0)I. Therefore, the algorithm has good convergence. It may be learned from the formula that the number of conditions of a signal autocorrelation matrix is 1 (a maximum sketch value of the matrix divided by a minimum sketch value of the matrix); however, the number of conditions of an input autocorrelation matrix of a general adaptive filtering algorithm is greater than 1. According to a theory of an adaptive algorithm, it may be learned that a convergence speed of adaptive filtering decreases as the number of conditions of an autocorrelation matrix increases. Therefore, a convergence speed of adaptive filtering based on an error sub-band is higher.

Figure 7:
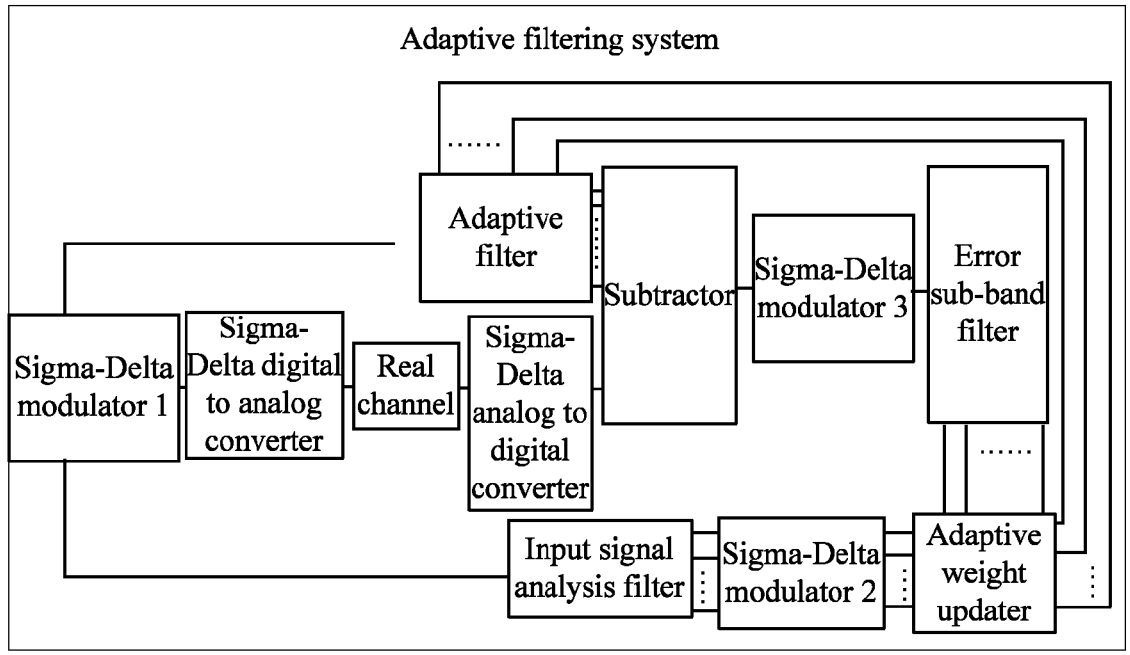
FIG. 7 is a composition block diagram of an adaptive filtering system based on an error sub-band according to Embodiment 2 of the present invention.

In addition, it should be noted that the adaptive filtering method that is based on an error sub-band and provided in this embodiment of the present invention may not only be used to simulate a digital channel, but also be used to simulate an analog channel. If a digital channel is to be simulated, the adaptive filtering method that is based on an error sub-band and provided in this embodiment of the present invention may be directly used. If an analog channel is to be simulated, a Sigma-Delta system needs to be further introduced in this embodiment of the present invention, and the system includes: a Sigma-Delt modulator, configured to perform over-sampling on an analog input signal at a speed greatly higher than a Nyquist sampling rate; a Sigma-Delta digital to analog converter, configured to perform digital to analog conversion on data; and a Sigma-Delta analog to digital converter, configured to perform analog to digital conversion on the data. An adaptive filtering system in which the Sigma-Delta system is introduced is shown in FIG. 7.

According to the adaptive filtering method that is based on an error sub-band and provided in this embodiment of the present invention, analysis filtering processing is performed on an error signal and an input signal to obtain an error sub-band signal and an input sub-band signal respectively; calculation is performed according to the input sub-band signal and the error sub-band signal to obtain a new adaptive filtering weight, and a weight in an adaptive filter is updated, so that when the adaptive filter works, the adaptive filter may directly use an updated weight to perform adaptive filter processing on the input signal, so as to obtain an adaptive filtering signal. Compared with a technical solution in the prior art, in which analysis filtering processing needs to be first performed on an input signal, and a processing result is input to an adaptive filter to perform adaptive processing to obtain an adaptive filtering sub-band signal, and then an adaptive filtering signal can be obtained by performing integrated filtering processing on the adaptive filtering sub-band signal, in the present invention, a processing result of an adaptive filter does not need to be restored; compared with the technical solution provided in the prior art, an integrated filter for signal reconstruction is omitted, thereby reducing the amount of calculation of an adaptive filtering algorithm.

Embodiment 3

This embodiment of the present invention provides an adaptive filtering system based on an error sub-band. Referring to FIG. 1, the system includes: an adaptive filter, a subtractor, an error sub-band filter, an input signal analysis filter, and an adaptive weight updater.

The adaptive filter is configured to receive an input signal, perform adaptive filtering processing on the input signal according to an adaptive filtering weight currently stored in the adaptive filter, so as to obtain an adaptive filtering signal, and transmit the adaptive filtering signal to the subtractor.

The subtractor is configured to receive a reference signal and the adaptive filtering signal, perform calculation according to the reference signal and the adaptive filtering signal to obtain an error signal, and transmit the error signal to the error sub-band filter, where the reference signal is a signal generated after the input signal passes through a real channel.

The error sub-band filter is configured to receive the error signal, perform sub-band analysis filtering processing on the error signal to obtain an error sub-band signal, and transmit the error sub-band signal to the adaptive weight updater.

The input signal analysis filter is configured to receive the input signal, perform sub-band analysis filtering processing on the input signal to obtain an input sub-band signal, and transmit the input sub-band signal to the adaptive weight updater.

The adaptive weight updater is configured to receive the error sub-band signal and the input sub-band signal, perform calculation according to the error sub-band signal and the input sub-band signal to obtain a new adaptive filtering weight, and replace the adaptive filtering weight currently stored in the adaptive filter with the new adaptive filtering weight.

Optionally, referring to FIG. 4, the foregoing adaptive filter has L branches that include a first branch to an $L^{th}$ branch, and each branch has one ingress port and one egress port, where L is a positive integer; when L is equal to 1, M multipliers, M−1 adders, and M−1 M-clock delayers are disposed in the $L^{th}$ branch, where the M multipliers are a multiplier 0 to a multiplier M−1, the M−1 adders are an adder 1 to an adder M−1, and the M−1 M-clock delayers are an M-clock delayer 1 to an M-clock delayer M−1; each delayer has one ingress port and one egress port, each multiplier has one ingress port and one egress port, and each adder has two ingress ports and one egress port; M is a positive integer; and an ingress port of the $L^{th}$ branch is connected to ingress ports of the multiplier 0 to the multiplier M−1, an egress port of the multiplier 0 is connected to an ingress port of the M-clock delayer 1, an egress port of each of a multiplier 1 to the multiplier M−1 is connected to one ingress port of each of the adder 1 to the adder M−1, and an egress port of each of the M-clock delayer 1 to the M-clock delayer M−1 is connected to the other ingress port of each of the adder 1 to the adder M−1; and when L is greater than 1, one (L−1)-clock delayer, M multipliers, M−1 adders, and M−1 M-clock delayers are disposed in the $L^{th}$ branch, where the M multipliers are a multiplier 0 to a multiplier M−1, the M−1 adders are an adder 1 to an adder M−1, and the M−1 M-clock delayers are an M-clock delayer 1 to an M-clock delayer M−1; each delayer has one ingress port and one egress port, each multiplier has one ingress port and one egress port, and each adder has two ingress ports and one egress port; and in the $L^{th}$ branch, an ingress port of the $L^{th}$ branch is connected to an ingress port of the (L−1)-clock delayer, an egress port of the (L−1)-clock delayer is connected to ingress ports of all multipliers, an egress port of the multiplier 0 is connected to an ingress port of the M-clock delayer 1, an egress port of each of a multiplier 1 to the multiplier M−1 is connected to one ingress port of each of the adder 1 to the adder M−1, and an egress port of each of the M-clock delayer 1 to the M-clock delayer M−1 is connected to the other ingress port of each of the adder 1 to the adder M−1.

Optionally, referring to FIG. 5, the foregoing error sub-band filter has N branches that include a first branch to an $N^{th}$ branch, and each branch has one ingress port and one egress port, where N is a positive integer; when X is equal to 1, one low-pass filter, one multiplier X−1, and one decimator X−1 are disposed in an $X^{th}$ branch; an ingress port of the low-pass filter is connected to an ingress port of the $X^{th}$ branch, an egress port of the low-pass filter is connected to an ingress port of the multiplier X−1, an egress port of the multiplier X−1 is connected to the decimator X−1, and an egress port of the decimator X−1 is connected to an egress port of the $X^{th}$ branch; when X is greater than 1 and less than N−1, one band-pass filter, one (X−1)-clock delayer, one multiplier X−1, and one decimator X−1 are disposed in an $X^{th}$ branch; an ingress port of the band-pass filter is connected to an ingress port of the $X^{th}$ branch, an egress port of the band-pass filter is connected to an ingress port of the (X−1)-clock delayer, an egress port of the (X−1)-clock delayer is connected to an ingress port of the multiplier X−1, an egress port of the multiplier X−1 is connected to the decimator X−1, and an egress port of the decimator X−1 is connected to an egress port of the $X^{th}$ branch; and when X is equal to N, one high-pass filter, one (X−1)-clock delayer, one multiplier X−1, and one decimator X−1 are disposed in an $X^{th}$ branch; an ingress port of the high-pass filter is connected to an ingress port of the $X^{th}$ branch, an egress port of the high-pass filter is connected to an ingress port of the (X−1)-clock delayer, an egress port of the (X−1)-clock delayer is connected to an ingress port of the multiplier X−1, an egress port of the multiplier X−1 is connected to the decimator X−1, and an egress port of the decimator X−1 is connected to an egress port of the $X^{th}$ branch.

Figure 8:
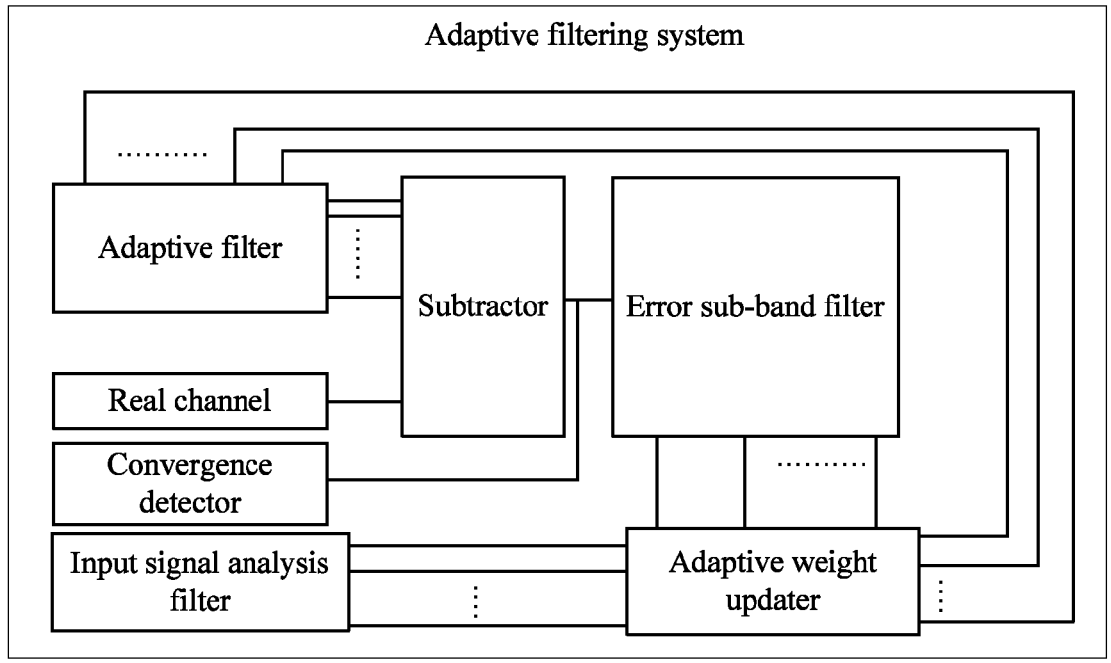
FIG. 8 is a composition block diagram of an adaptive filtering system based on an error sub-band according to Embodiment 3 of the present invention.

Optionally, as shown in FIG. 8, the system further includes a convergence detector.

The convergence detector is configured to determine whether the error signal is converged; and if it is determined that the error signal is converged, control the subtractor to generate a simulation signal according to the adaptive filtering signal and output the simulation signal.

According to the adaptive filtering apparatus that is based on an error sub-band and provided in this embodiment of the present invention, analysis filtering processing is performed on an error signal and an input signal to obtain an error sub-band signal and an input sub-band signal respectively; calculation is performed according to the input sub-band signal and the error sub-band signal to obtain a new adaptive filtering weight, so that when a signal is output, the input signal does not need to be restored. Compared with a technical solution provided in the prior art, an integrated filter for signal reconstruction is omitted, thereby reducing the amount of calculation of an adaptive filtering algorithm.

Based on the foregoing descriptions of the implementation manners, a person skilled in the art may clearly understand that the present invention may be implemented by software in addition to necessary universal hardware or by hardware. In most circumstances, the former is a preferred implementation manner. Based on such an understanding, the technical solutions of the present invention essentially or the part contributing to the prior art may be implemented in a form of a software product. The computer software product is stored in a readable storage medium, such as a floppy disk, a hard disk or an optical disc of a computer, and includes several instructions for instructing a computer device (which may be a personal computer, a server, or a network device) to perform the methods described in the embodiments of the present invention.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An adaptive filtering method based on an error sub-band, the method comprising:
   receiving, by an adaptive filter, an input signal;
   performing adaptive filtering processing on the input signal according to an adaptive filtering weight currently stored in the adaptive filter, so as to obtain an adaptive filtering signal, and transmitting the adaptive filtering signal to a subtractor, wherein the adaptive filter has L branches that comprise a first branch to an $L^{th}$ branch, and each branch has M multipliers, one ingress port, and one egress port, wherein L is a positive integer greater than 1 and M is a positive integer greater than 1;
   receiving, by the subtractor, a reference signal and the adaptive filtering signal;
   performing a calculation according to the reference signal and the adaptive filtering signal to obtain an error signal;
   transmitting the error signal to an error sub-band filter, wherein the reference signal is a signal generated after the input signal passes through a real channel;
   receiving, by the error sub-band filter, the error signal;
   performing sub-band analysis filtering processing on the error signal to obtain an error sub-band signal;
   transmitting the error sub-band signal to an adaptive weight updater;
   receiving, by an input signal analysis filter, the input signal;
   performing sub-band analysis filtering processing on the input signal to obtain an input sub-band signal;
   transmitting the input sub-band signal to the adaptive weight updater;

receiving, by the adaptive weight updater, the error sub-band signal and the input sub-band signal;

performing calculation according to the error sub-band signal and the input sub-band signal to obtain a new adaptive filtering weight; and replacing the adaptive filtering weight currently stored in the adaptive filter with the new adaptive filtering weight.

2. The method according to claim 1, wherein the adaptive filter has a first branch of the L branches;

wherein M first multipliers, M−1 adders, and M−1 M-clock delayers are disposed in the first branch;

wherein the M first multipliers comprise a first multiplier 0 to a first multiplier M−1;

wherein the M−1 adders comprise an adder 1 to an adder M−1;

wherein the M−1 M-clock delayers comprise an M-clock delayer 1 to an M-clock delayer M−1;

wherein each delayer has one ingress port and one egress port;

wherein each first multiplier has one ingress port and one egress port;

wherein each adder has two ingress ports and one egress port;

wherein an ingress port of the first branch is connected to ingress ports of the first multiplier 0 to the first multiplier M−1;

wherein an egress port of the first multiplier 0 is connected to an ingress port of the M-clock delayer 1;

wherein an egress port of each of a first multiplier 1 to the first multiplier M−1 is connected to one ingress port of each of the adder 1 to the adder M−1; and wherein an egress port of each of the M-clock delayer 1 to the M-clock delayer M−1 is connected to the other ingress port of each of the adder 1 to the adder M−1.

3. The method according to claim 2, wherein receiving, by the adaptive filter, the input signal and performing adaptive filtering processing on the input signal according to the adaptive filtering weight currently stored in the adaptive filter, so as to obtain an adaptive filtering signal, comprises:

in the first branch, receiving, by each of the first multiplier 0 to the first multiplier M−1, the input signal through the ingress port of the first branch;

performing multiplication on the input signal according to an adaptive filtering weight stored in each of the first multipliers, to obtain a multiplier output signal generated by each of the first multiplier 0 to the first multiplier M−1;

outputting, by each of the first multiplier 0 to the first multiplier M−1 through an egress port of each of the first multiplier 0 to the first multiplier M−1, the multiplier output signal generated by each of the first multiplier 0 to the first multiplier M−1;

performing, by each of the M-clock delayer 1 to the M-clock delayer M−1, M-clock delay processing on a signal received at an ingress port of each of the M-clock delayer 1 to the M-clock delayer M−1, to obtain an M-clock delay signal generated by each of the M-clock delayer 1 to the M-clock delayer M−1;

outputting, by each of the M-clock delayer 1 to the M-clock delayer M−1 through the egress port of each of the M-clock delayer 1 to the M-clock delayer M−1, the M-clock delay signal generated by each of the M-clock delayer 1 to the M-clock delayer M−1;

performing, by the adder 1 to the adder M−1, addition processing on signals received through two ingress ports corresponding to each of the adder 1 to the adder M−1, to obtain an adder output signal generated by each of the adder 1 to the adder M−1; and outputting, by each of the adder 1 to the adder M−1 through an egress port corresponding to each of the adder 1 to the adder M−1, the adder output signal generated by each of the adder 1 to the adder M−1.

4. The method according to claim 1, wherein one (L−1)-clock delayer, M second multipliers, M−1 adders, and M−1 M-clock delayers are disposed in the $L^{th}$ branch;

wherein the M second multipliers in the $L^{th}$ branch are a second multiplier 0 to a second multiplier M−1;

wherein the M−1 adders are an adder 1 to an adder M−1;

wherein the M−1 M-clock delayers are an M-clock delayer 1 to an M-clock delayer M−1;

wherein each delayer has one ingress port and one egress port;

wherein each second multiplier has one ingress port and one egress port;

wherein each adder has two ingress ports and one egress port; and wherein, in the $L^{th}$ branch, an ingress port of the $L^{th}$ branch is connected to an ingress port of the (L−1)-clock delayer, an egress port of the (L−1)-clock delayer is connected to ingress ports of all second multipliers, an egress port of the second multiplier 0 is connected to an ingress port of the M-clock delayer 1, an egress port of each of a second multiplier 1 to the second multiplier M−1 is connected to one ingress port of each of the adder 1 to the adder M−1, and an egress port of each of the M-clock delayer 1 to the M-clock delayer M−1 is connected to the other ingress port of each of the adder 1 to the adder M−1.

5. The method according to claim 4, wherein receiving, by the adaptive filter, the input signal, performing the adaptive filtering processing on the input signal according to the adaptive filtering weight currently stored in the adaptive filter comprises:

in the $L^{th}$ branch, receiving, by the (L−1)-clock delayer, the input signal through the ingress port of the (L−1)-clock delayer;

performing (L−1)-clock delay processing on the input signal to generate an (L−1)-clock delay signal;

outputting, by the (L−1)-clock delayer, the (L−1)-clock delay signal through the egress port of the (L−1)-clock delayer;

receiving, by each of the second multiplier 0 to the second multiplier M−1 in the $L^{th}$ branch, the (L−1)-clock delay signal through the ingress port of the $L^{th}$ branch;

performing multiplication on the (L−1)-clock delay signal according to an adaptive filtering weight stored in each of the second multipliers, to obtain a multiplier output signal generated by each of the second multiplier 0 to the second multiplier M−1;

outputting, by each of the second multiplier 0 to the second multiplier M−1 through an egress port of each of the second multiplier 0 to the second multiplier M−1, the multiplier output signal generated by each of the second multiplier 0 to the second multiplier M−1;

performing, by each of the M-clock delayer 1 to the M-clock delayer M−1, M-clock delay processing on a signal received at an ingress port of each of the M-clock delayer 1 to the M-clock delayer M−1, to obtain a delay signal generated by each of the M-clock delayer 1 to the M-clock delayer M−1;

outputting, by each of the M-clock delayer 1 to the M-clock delayer M−1 through the egress port of each of the M-clock delayer 1 to the M-clock delayer M−1, the delay signal generated by each of the M-clock delayer 1 to the M-clock delayer M−1;

performing, by each of the adder 1 to the adder M−1, addition processing on signals received through two ingress ports corresponding to each of the adder 1 to the adder M−1, to obtain an adder output signal generated by each of the adder 1 to the adder M−1; and outputting, by each of the adder 1 to the adder M−1 through an egress port corresponding to each of the adder 1 to the adder M−1, the adder output signal generated by each of the adder 1 to the adder M−1.

6. The method according to claim 1, wherein the error sub-band filter has N branches that comprise a first branch to an $N^{th}$ branch, and each branch has one ingress port and one egress port, wherein N is a positive integer;

wherein X is an integer equal to 1;

wherein one low-pass filter, one multiplier X−1, and one decimator X−1 are disposed in an $X^{th}$ branch;

wherein an ingress port of the low-pass filter is connected to an ingress port of the $X^{th}$ branch;

wherein an egress port of the low-pass filter is connected to an ingress port of the multiplier X−1;

wherein an egress port of the multiplier X−1 is connected to the decimator X−1; and wherein an egress port of the decimator X−1 is connected to an egress port of the $X^{th}$ branch.

7. The method according to claim 6, wherein receiving, by the error sub-band filter, the error signal, performing sub-band analysis filtering processing on the error signal to obtain an error sub-band signal comprises:

receiving, by the low-pass filter, the error signal through the ingress port of the low-pass filter;

performing filtering processing on the error signal according to band-pass setting of the low-pass filter to obtain a low-pass filter signal;

outputting, by the low-pass filter, the low-pass filter signal through the egress port of the low-pass filter;

performing, by the multiplier X−1 according to a weight stored in the multiplier X−1, multiplication processing on a signal received through the ingress port of the multiplier X−1, to obtain a multiplier output signal;

outputting, by the multiplier X−1, the multiplier output signal through the egress port of the multiplier X−1;

performing, by the decimator X−1, X times down sampling processing on a signal received through an ingress port of the decimator X−1, to obtain an error sub-band signal of the $X^{th}$ branch; and outputting, by the decimator X−1, the error sub-band signal of the $X^{th}$ branch through the egress port of the decimator X−1.

8. The method according to claim 1, wherein the error sub-band filter has N branches that comprise a first branch to an $N^{th}$ branch, and each branch has one ingress port and one egress port, wherein N is a positive integer greater than 2;

wherein X is an integer greater than 1 and less than N−1;

wherein one band-pass filter, one (X−1)-clock delayer, one multiplier X−1, and one decimator X−1 are disposed in an $X^{th}$ branch;

wherein an ingress port of the band-pass filter is connected to an ingress port of the $X^{th}$ branch;

wherein an egress port of the band-pass filter is connected to an ingress port of the (X−1)-clock delayer;

wherein an egress port of the (X−1)-clock delayer is connected to an ingress port of the multiplier X−1;

wherein an egress port of the multiplier X−1 is connected to the decimator X−1; and wherein an egress port of the decimator X−1 is connected to an egress port of the $X^{th}$ branch.

9. The method according to claim 8, wherein receiving, by the error sub-band filter, the error signal, performing sub-band analysis filtering processing on the error signal to obtain the error sub-band signal comprises:

receiving, by the band-pass filter, the error signal through the ingress port of the band-pass filter;

performing filtering processing on the error signal according to band-pass setting of the band-pass filter to obtain a band-pass filter signal;

outputting, by the band-pass filter, the band-pass filter signal through the egress port of the band-pass filter;

performing, by the (X−1)-clock delayer, (X−1)-clock delay processing on a signal received through the ingress port of the (X−1)-clock delayer, to obtain a delay signal;

outputting, by the (X−1)-clock delayer, the delay signal through the egress port of the (X−1)-clock delayer;

performing, by the multiplier X−1 according to a weight stored in the multiplier X−1, multiplication processing on a signal received through the ingress port of the multiplier X−1, to obtain a multiplier output signal;

outputting, by the multiplier X−1, the multiplier output signal through the egress port of the multiplier X−1;

performing, by the decimator X−1, X times down sampling processing on a signal received through an ingress port of the decimator X−1, to obtain an error sub-band signal of the $X^{th}$ branch; and outputting, by the decimator X−1, the error sub-band signal of the $X^{th}$ branch through the egress port of the decimator X−1.

10. The method according to claim 1, wherein the error sub-band filter has N branches that comprise a first branch to an $N^{th}$ branch, and each branch has one ingress port and one egress port, wherein N is a positive integer;

wherein X in an integer equal to N;

wherein one high-pass filter, one (X−1)-clock delayer, one multiplier X−1, and one decimator X−1 are disposed in an $X^{th}$ branch;

wherein an ingress port of the high-pass filter is connected to an ingress port of the $X^{th}$ branch;

wherein an egress port of the high-pass filter is connected to an ingress port of the (X−1)-clock delayer;

wherein an egress port of the (X−1)-clock delayer is connected to an ingress port of the multiplier X−1;

wherein an egress port of the multiplier X−1 is connected to the decimator X−1; and wherein an egress port of the decimator X−1 is connected to an egress port of the $X^{th}$ branch.

11. The method according to claim 10, wherein receiving, by the error sub-band filter, the error signal and performing sub-band analysis filtering processing on the error signal to obtain the error sub-band signal comprises:

receiving, by the high-pass filter, the error signal through the ingress port of the high-pass filter, and performing filtering processing on the error signal according to high-pass setting of the high-pass filter to obtain a high-pass filter signal;

outputting, by the high-pass filter, the high-pass filter signal through the egress port of the high-pass filter; performing, by the (X−1)-clock delayer, (X−1)-clock delay processing on a signal received through the ingress port of the (X−1)-clock delayer, to obtain a delay signal;

outputting, by the (X−1)-clock delayer, the delay signal through the egress port of the (X−1)-clock delayer; performing, by the multiplier X−1 according to a weight stored in the multiplier X−1, multiplication processing on a signal received through the ingress port of the multiplier X−1, to obtain a multiplier output signal;

outputting, by the multiplier X−1, the multiplier output signal through the egress port of the multiplier X−1;

performing, by the decimator X−1, X times down sampling processing on a signal received through an ingress port of the decimator X−1, to obtain an error sub-band signal of the $X^{th}$ branch; and outputting, by the decimator X−1, the error sub-band signal of the $X^{th}$ branch through the egress port of the decimator X−1.

12. The method according to claim 1, wherein after receiving, by the subtractor, the reference signal and the adaptive filtering signal and performing the calculation according to the reference signal and the adaptive filtering signal to obtain the error signal, the method further comprises:

determining, by a convergence detector, whether the error signal is converged; and if it is determined that the error signal is converged, controlling, by the convergence detector, the subtractor to generate a simulation signal according to the adaptive filtering signal and output the simulation signal.

13. An adaptive filtering system based on an error sub-band, comprising:

an adaptive filter, configured to receive an input signal, perform adaptive filtering processing on the input signal according to an adaptive filtering weight currently stored in the adaptive filter, so as to obtain an adaptive filtering signal, and transmit the adaptive filtering signal to a subtractor, wherein the adaptive filter has L branches that comprise a first branch to an $L^{th}$ branch, and each branch has M multipliers, one ingress port, and one egress port, wherein L is a positive integer greater than 1 and M is a positive integer greater than 1;

the subtractor, configured to receive a reference signal and the adaptive filtering signal, perform calculation according to the reference signal and the adaptive filtering signal to obtain an error signal, and transmit the error signal to an error sub-band filter, wherein the reference signal is a signal generated after the input signal passes through a real channel;

the error sub-band filter, configured to receive the error signal, perform sub-band analysis filtering processing on the error signal to obtain an error sub-band signal, and transmit the error sub-band signal to an adaptive weight updater;

an input signal analysis filter, configured to receive the input signal, perform sub-band analysis filtering processing on the input signal to obtain an input sub-band signal, and transmit the input sub-band signal to the adaptive weight updater; and the adaptive weight updater, configured to receive the error sub-band signal and the input sub-band signal, perform calculation according to the error sub-band signal and the input sub-band signal to obtain a new adaptive filtering weight, and replace the adaptive filtering weight currently stored in the adaptive filter with the new adaptive filtering weight.

14. The system according to claim 13, wherein one (L−1)-clock delayer, M second multipliers, M−1 adders, and M−1 M-clock delayers are disposed in the $L^{th}$ branch, wherein the M second multipliers are a second multiplier 0 to a second multiplier M−1, the M−1 adders are an adder 1 to an adder M−1, and the M−1 M-clock delayers are an M-clock delayer 1 to an M-clock delayer M−1; each delayer has one ingress port and one egress port, each second multiplier has one ingress port and one egress port, and each adder has two ingress ports and one egress port; and in the $L^{th}$ branch, an ingress port of the $L^{th}$ branch is connected to an ingress port of the (L−1)-clock delayer, an egress port of the (L−1)-clock delayer is connected to ingress ports of all second multipliers, an egress port of the second multiplier 0 is connected to an ingress port of the M-clock delayer 1, an egress port of each of a second multiplier 1 to the second multiplier M−1 is connected to one ingress port of each of the adder 1 to the adder M−1, and an egress port of each of the M-clock delayer 1 to the M-clock delayer M−1 is connected to the other ingress port of each of the adder 1 to the adder M−1.

15. The system according to claim 13, wherein the error sub-band filter has N branches that comprise a first branch to an $N^{th}$ branch, and each branch has one ingress port and one egress port, wherein N is a positive integer;

when X is equal to 1, one low-pass filter, one multiplier X−1, and one decimator X−1 are disposed in an $X^{th}$ branch; an ingress port of the low-pass filter is connected to an ingress port of the $X^{th}$ branch, an egress port of the low-pass filter is connected to an ingress port of the multiplier X−1, an egress port of the multiplier X−1 is connected to the decimator X−1, and an egress port of the decimator X−1 is connected to an egress port of the $X^{th}$ branch;

when X is greater than 1 and less than N−1, one band-pass filter, one (X−1)-clock delayer, one multiplier X−1, and one decimator X−1 are disposed in an $X^{th}$ branch; an ingress port of the band-pass filter is connected to an ingress port of the $X^{th}$ branch, an egress port of the band-pass filter is connected to an ingress port of the (X−1)-clock delayer, an egress port of the (X−1)-clock delayer is connected to an ingress port of the multiplier X−1, an egress port of the multiplier X−1 is connected to the decimator X−1, and an egress port of the decimator X−1 is connected to an egress port of the $X^{th}$ branch; and when X is equal to N, one high-pass filter, one (X−1)-clock delayer, one multiplier X−1, and one decimator X−1 are disposed in an $X^{th}$ branch, an ingress port of the high-pass filter is connected to an ingress port of the $X^{th}$ branch, an egress port of the high-pass filter is connected to an ingress port of the (X−1)-clock delayer, an egress port of the (X−1)-clock delayer is connected to an ingress port of the multiplier X−1, an egress port of the multiplier X−1 is connected to the decimator X−1, and an egress port of the decimator X−1 is connected to an egress port of the $X^{th}$ branch.

16. The system according to claim 13, further comprising a convergence detector, configured to determine whether the error signal is converged; and if it is determined that the error signal is converged, control the subtractor to generate a simulation signal according to the adaptive filtering signal and output the simulation signal.

17. An adaptive filtering system based on an error sub-band, comprising a processor and a computer-readable storage medium storing a program to be executed by the processor, the program including instructions for:

receiving an input signal;

performing adaptive filtering processing on the input signal according to an adaptive filtering weight currently stored in an adaptive filter, so as to obtain an adaptive filtering signal; performing a calculation according to a reference signal and the adaptive filtering signal to obtain an error signal, wherein the reference signal is a signal generated after the input signal passes through a real channel;

performing sub-band analysis filtering processing on the error signal to obtain an error sub-band signal;

performing sub-band analysis filtering processing on the input signal to obtain an input sub-band signal;

performing calculation according to the error sub-band signal and the input sub-band signal to obtain a new adaptive filtering weight; and replacing the adaptive filtering weight currently stored in the adaptive filter with the new adaptive filtering weight;

wherein the adaptive filter has L branches that comprise a first branch to an $L^{th}$ branch, and each branch has M multipliers, one ingress port, and one egress port, wherein L is a positive integer greater than 1 and M is a positive integer greater than 1.

* * * * *